United States Patent [19]

Oritani

[11] Patent Number: 4,464,581
[45] Date of Patent: Aug. 7, 1984

[54] TRIGGER PULSE GENERATOR

[75] Inventor: Atsushi Oritani, Yokohama, Japan

[73] Assignee: Fujitsu Limited, Kawasaki, Japan

[21] Appl. No.: 371,503

[22] Filed: Apr. 23, 1982

[30] Foreign Application Priority Data

Apr. 28, 1981 [JP] Japan ................... 56-64442

[51] Int. Cl.³ ............... H03K 3/017; H03K 5/04; H03K 5/153
[52] U.S. Cl. .................... 307/265; 307/268; 307/497; 307/571
[58] Field of Search ............. 307/265, 269, 268, 494, 307/495, 496, 497, 571; 330/253, 262, 264

[56] References Cited

U.S. PATENT DOCUMENTS

| | | | |
|---|---|---|---|
| 4,020,365 | 4/1977 | Weir | 307/571 |
| 4,035,663 | 7/1977 | Stodola | 307/269 |
| 4,071,777 | 1/1978 | Herrmann | 307/494 |
| 4,101,966 | 7/1978 | Uzunoglu | 307/494 |
| 4,314,166 | 2/1982 | Bismarck | 307/268 |

OTHER PUBLICATIONS

IBM Technical Disclosure Bulletin, "Pulse (Glitch) Generator", by Bucek et al., vol. 22, No. 8A, Jan. 1980, p. 3185.
Electronic Design, "Single-Gate Transition Detector Responds to Positive and Negative Edges", by Orton, vol. 27, No. 14, Jul. 1979, p. 84.

Primary Examiner—John S. Heyman
Assistant Examiner—Timothy P. Callahan
Attorney, Agent, or Firm—Staas & Halsey

[57] ABSTRACT

A trigger pulse generator generates trigger pulses synchronized with the rising edges and falling edges of an input signal and is used, for example, in a semiconductor memory device in order to shorten the access time. The trigger pulse generator according to the present invention comprises: an amplifier which outputs a non-inverted signal of the input signal and an inverted signal of the input signal; a pair of depletion-type MIS transistors whose drains or sources are connected to the non-inverting output terminal and to the inverting output terminal of the amplifier and whose gate electrodes are connected to the inverting output terminal and the non-inverting output terminal, respectively; and a gate circuit which is connected to the sources or drains of the pair of depletion-type MIS transistors and which outputs the trigger pulses.

8 Claims, 5 Drawing Figures

TRIGGER PULSE GENERATOR

BACKGROUND OF THE INVENTION (1) Field of the Invention

The present invention relates to a trigger pulse generator which generates trigger pulses synchronized with the leading edges and trailing edges of an input signal and used, for example, in a semiconductor memory device.

(2) Description of the Prior Art

In a semiconductor memory device such as a static-type random access memory device, if the potentials of the bit lines of each bit line pair are preset at the same high level when the input address signals are changed and the readout of information is effected, it is possible to obtain a short access time. In order to effect presetting of the bit line potentials, transistor switches are connected between the bit lines of each bit line pair and the voltage source, and the transistor switches are temporarily turned on under the control of the trigger pulses.

FIG. 1 is a conventional trigger pulse generator for generating trigger pulses used for the above-mentioned purpose. In FIG. 1, 10 designates an amplifier which outputs a non-inverted output signal B, i.e., A', and an inverted output signal C of the input signal A, i.e., $\overline{A}$'; 12, 14, 16, and 18 are inverters; 20 is a NOR gate; and 22 and 24 are capacitors which are, respectively, connected between a non-inverting output terminal $T_1$ and ground and between an inverting output terminal $T_2$ and ground. If the trigger pulse generator of FIG. 1 is used in a semiconductor memory device, the input signal A is an address signal and the amplifier 10 is an address inverter. Although the detailed circuit structure of the amplifier 10 is not shown in the drawing, each of the output stages of the amplifier 10 usually comprises an enhancement-type or depletion-type field effect transistor (FET) which serves as a load element and whose gate and drain are commonly connected to each other, and an enhancement-type driver FET which is connected in series with the load element and which receives an input signal. When the input signal A illustrated in FIG. 2 is applied to the input terminal of the amplifier 10, the amplifier 10 outputs the non-inverted output signal A' and the inverted output signal $\overline{A}$'. Since the capacitors 22 and 24 are charged and discharged by these output signals, the waveforms of the output signals of the output terminals $T_1$ and $T_2$ become as shown by B and C of FIG. 2. The discharge of electric charges in the capacitor 22 or 24 is effected rapidly through the above-mentioned driver FET which is turned on, and, therefore, each of the output signals falls quickly. Charging of the capacitor 22 or 24 is effected gradually through the load FET so that each of the output signals rises slowly. The two-stage inverters 12, 16 and 14, 18 effect wave shaping of the output signals B and C and output rectangular wave signals B' and C' whose rising edges are delayed by the time period t from the rising edge or the falling edge of the input signal A. The signals B' and C' are supplied to the NOR gate 20, and the NOR gate 20 outputs trigger pulses D, each of which is generated at the falling edge or the rising edge of the input signal A and each of which has a rectangular shape and a small width.

However, the above-mentioned conventional trigger pulse generator has a disadvantage in that the width of each of the output pulses varies in accordance with the change in the power supply voltage $V_{cc}$. The high level of the output signals B and C from the amplifier 10 is substantially equal to the power supply voltage $V_{cc}$ and the low level of the output signals B and C is substantially equal to ground level. Therefore, when the power supply voltage $V_{cc}$ falls, the waveforms of the output signals B and C become as shown by the dotted lines, so that the width of the output trigger pulse D becomes large. It is preferable that the width of the output trigger pulse D be constant, and it not vary with the variation of the power supply voltage. For example, in a circuit generating clock pulses at the falling edges of the above-mentioned output trigger pulses D, the generated timing of the clock pulses unstably varies in accordance with the variation of the power supply voltage.

In the trigger pulse generator of FIG. 1, since the timing of the rising edges of the output signals B and C of the amplifier 10 is delayed by the capacitors 22 and 24, it is necessary to use capacitors having a large capacitance in order to generate the trigger pulses D, each having a large pulse width. Therefore, when the trigger pulse generator of FIG. 1 is formed in an integrated circuit, it is necessary to use separate discrete capacitors outside the integrated circuit.

SUMMARY OF THE INVENTION

It is, therefore, a principal object of the present invention to provide a trigger pulse generator in which the width of the output trigger pulses does not vary although the potential of the power supply voltage changes.

It is another object of the present invention to provide a trigger pulse generator in which capacitors having a large capacitance for delaying signals are not used.

It is still another object of the present invention to provide a trigger pulse generator which is suitable for use in an integrated circuit device.

According to the present invention, there is provided a trigger pulse generator for generating trigger pulses synchronized with the rising edges and falling edges of an input signal. The trigger pulse generator comprises: an amplifier which outputs a non-inverted output signal of the input signal at a non-inverting output terminal and an inverted output signal of the input signal at an inverting output terminal; a first depletion-type MIS transistor whose drain or source electrode is connected to the non-inverting output terminal of the amplifier and whose gate electrode is connected to the inverting output terminal of the amplifier; a second depletion-type MIS transistor whose drain or source electrode is connected to the inverting output terminal of the amplifier and whose gate electrode is connected to the non-inverting output terminal of the amplifier; and a gate circuit which generates trigger pulses with the rising edges and the falling edges of the input signal by using the signals from the source or drain electrodes of the first depletion-type MIS transistor and the second depletion-type MIS transistor.

DESCRIPTION OF THE PREFERRED EMBODIMENT

Figure 1:
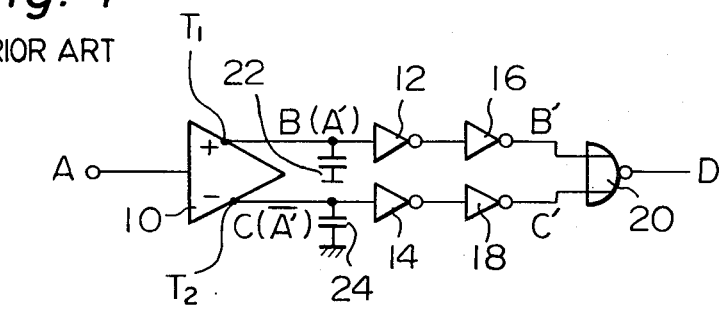
FIG. 1 is a block circuit diagram of a conventional trigger pulse generator.
Figure 2:
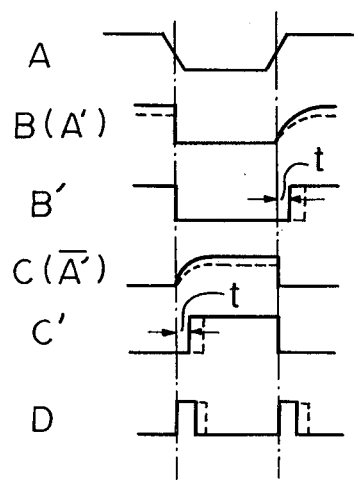
FIG. 2 is a waveform diagram of the operation of the trigger pulse generator of FIG. 1.
Figure 3:
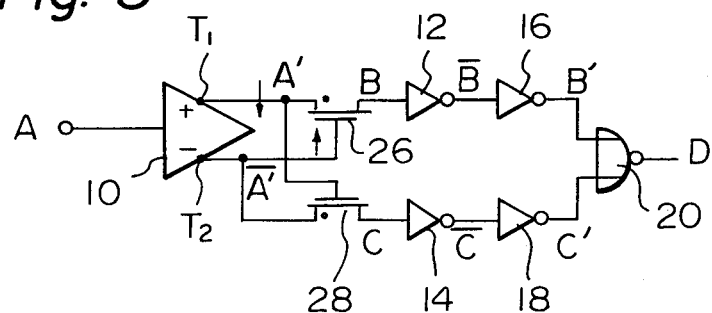
FIG. 3 is a block circuit diagram of a trigger pulse generator of an embodiment of the present invention.

The present invention will now be explained with reference to the attached drawings. As illustrated in FIG. 3, a trigger pulse generator according to the present invention comprises the same elements as the trigger pulse generator of FIG. 1, further comprising an amplifier 10 generating a non-inverted output signal $A'$ and an inverted output signal $\overline{A}'$, inverters 12, 14, 16, and 18, and a NOR gate 20. The trigger pulse generator of FIG. 3 further comprises depletion-type MIS field effect transistors 26 and 28 which are used instead of the capacitors 22 and 24 of the generator of FIG. 1. The drain or source of the transistor 26 is connected to the non-inverting output terminal $T_1$ of the amplifier 10 and the gate of the transistor 26 is connected to the inverting output terminal $T_2$ of the amplifier 10. The drain or source of the transistor 28 is connected to the inverting output terminal $T_2$ and the gate of the transistor 28 is connected to the non-inverting output terminal $T_1$. The sources or drains of the transistors 26 and 28 are connected to the inverters 12 and 14, respectively.

Figure 4:
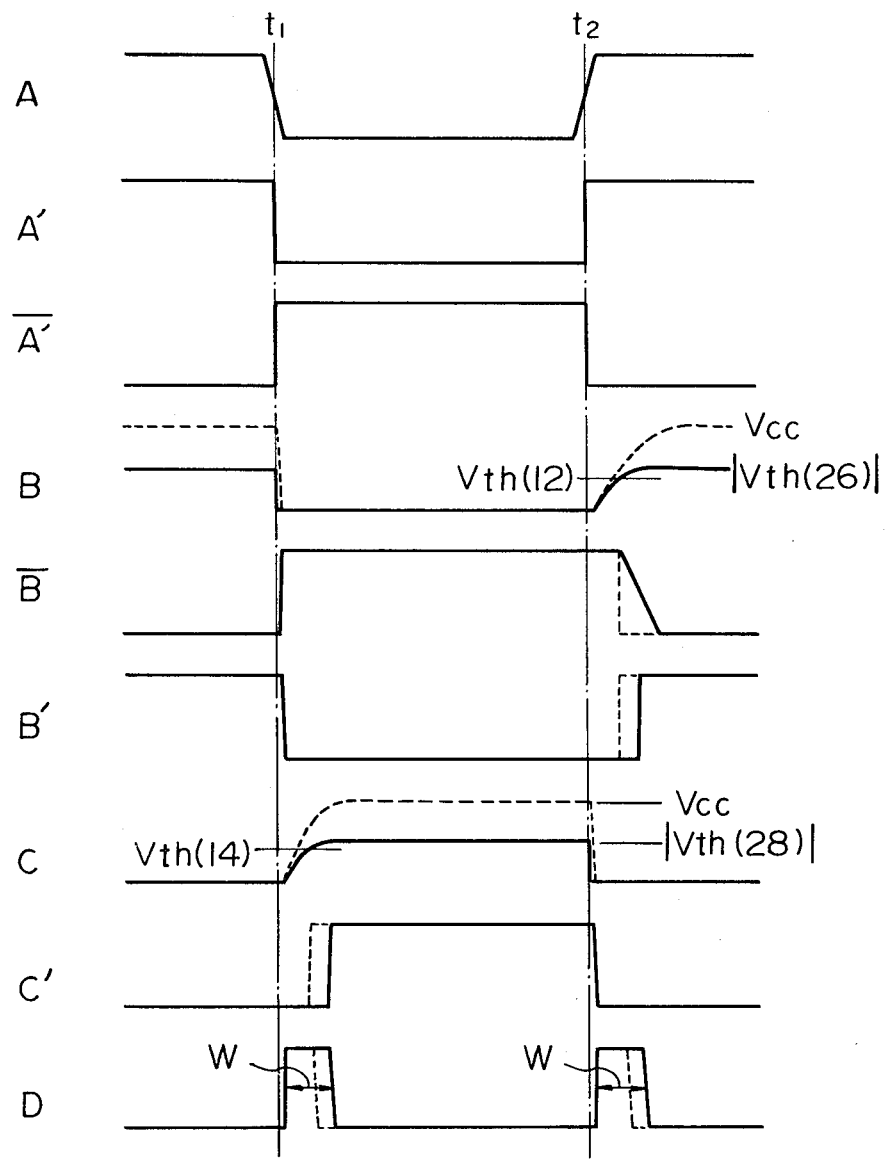
FIG. 4 is a waveform diagram of the operation of the trigger pulse generator of FIG. 3.

FIG. 4 illustrates the waveforms at the nodes of the trigger pulse generator of FIG. 3. With reference to FIG. 4, operation of the circuit of FIG. 3 will be explained. When an input signal A changes from high to low at time t1, the non-inverting output $A'$ from the amplifier 10 rapidly changes from high to low and the inverting output $\overline{A}'$ from the amplifier 10 rapidly changes from low to high. Therefore, the gate-source potential of the depletion transistor 26 rises and the gate-source potential of the depletion transistor 28 falls, so that the gm (transconductance) of the transistor 26 becomes large and the gm of the transistor 28 becomes small. As a result, the output signal $A'$ of the non-inverting output terminal $T_1$ is immediately transferred to the inverter 12 through the transistor 26 having the large gm. In this case, electric charges in the stray capacitance at the input circuit of the inverter 12 are also quickly discharged. The output signal $\overline{A}'$ of the inverting output terminal $T_2$ is gradually transferred to the inverter 14 through the transistor 28 having the small gm. In this case, the stray capacitance at the input circuit 14 is gradually charged with a time constant determined by the stray capacitance and the resistance of the transistor 28. Therefore, as illustrated in FIG. 4, the input signal B applied to the inverter 12 falls rapidly at time t1, and the input signal C applied to the inverter 14 rises gradually at time t1.

If the input signal A to the trigger pulse generator of FIG. 3 rises from low to high at time t2, the gm of the transistor 26 becomes small and the gm of the transistor 28 becomes large. Therefore, the stray capacitance at the input terminal of the inverter 12 is charged through the transistor 26 having a small gm, and the electric charges of the stray capacitance of the input terminal of the inverter 14 are discharged through the transistor 28 having a large gm. The input signal B to the inverter 12 rises slowly and the input signal C to the inverter 14 falls quickly at time t2. Two-stage inverters 12, 16 and, 14, 18 effect wave shaping of the input signals B and C, respectively, and output rectangular signals $B'$ and $C'$ whose rising edges delay for a time period t from times t2 and t1. These signals $B'$ and $C'$ are supplied to the NOR gate 20, and a trigger pulse output D, which synchronizes with the falling and rising edges of the input signal A and has a small width, is obtained.

In the circuit of FIG. 3, the width W of each of the output pulses D is substantially determined by the gm's of the transistors 26 and 28, the threshold potentials Vth of the inverters 12 and 14, and the stray capacitances of the input circuits of the inverters 12 and 14. The width W is not affected by the change in the power supply voltage. In the circuit of FIG. 3, it is not necessary to use capacitors each having a large capacitance such as the capacitors 22 and 24 in the circuit of FIG. 1, so that the trigger pulse generator of FIG. 3 is suitable for use in an integrated circuit. When capacitors are connected between the input terminals of the inverters 12 and 14 and, for example, ground, the input capacitances of the inverters 12 and 14 become large and the delay time of each of the rising edges of the output pulses $B'$ and $C'$ from the inverters 16 and 18 becomes large, so the width of each of the trigger pulses D as large. In this case, it is not necessary to use capacitors having a large capacitance, such as the capacitors 22 and 24, because the inner resistance of the transistor 26 or 28 and the time constant of the input circuit of each of the inverters 12 and 14 can be large even when the capacitance of the capacitors is small. Therefore, as mentioned above, it is easy to build the trigger pulse generator of FIG. 3 in an integrated circuit.

It should be noted that in the trigger pulse generator of FIG. 3 the potential of the high level signal of each of the output signals B and C from the transistors 26 and 28 rises only to the threshold potential $|Vth|$ of each of the transistors 26 and 28 and does not rise to the power supply voltage. This is because when the signal $A'$ from the output terminal $T_1$, which is applied to, for example, the drain of the transistor 26, rises, and the signal $\overline{A}'$ from the output terminal $T_2$, which is applied to the gate of the transistor 26, falls, the output signal B from the source of the transistor 26 rises and the backgate effect in the transistor 26 becomes remarkable, so that the potential rise of the output signal B deteriorates. When the output signal B rises to the threshold potential level $|Vth(26)|$ of the transistor 26, the transistor 26 is turned off, so that the potential rise of the output signal B is suppressed. Therefore, the potential of the high level of the output signals B and C is not influenced by a change in the power supply voltage. Moreover, in each of the depletion transistors 26 and 28, the drain-source current depends primarily only on the gate potential and does not change according to the change in the drain-source voltage in the region in which the drain-source voltage is large. Therefore, the delay time of the rising edge of each of the signals B and C does not change when the power supply voltage changes, so that the width of each of the output trigger pulses D is maintained at a constant value even when the power supply voltage changes.

As illustrated by B in FIG. 4, the high level potential of the signal B does not become higher than the threshold potential $|Vth(26)|$ of the transistor 26, which is slightly higher than the threshold potential Vth(12) of the inverter 12, and the inverter 12 is overdriven only by a small voltage. Therefore, the output signal $\overline{B}$ from the first inverter 12 falls very slowly, and the rising edge of the output signal $B'$ of the second inverter 16 is greatly delayed. The rising edge of the output signal $C'$ from the inverter 18 is also delayed in a manner similar to that of the output signal B'. Therefore, the width W of each of the trigger pulses D can be very large. In FIG. 4, the dotted lines show the waveforms of the signals of the conventional trigger pulse generator of FIG. 1. In the conventional trigger pulse generator, the input signals B and C rise approximately to the power supply voltage $V_{cc}$, and the inverters 12 and 14 are overdriven. Therefore, the output potentials of the first inverters 12 and 14 fall quickly and it is necessary to use the capacitors 22 and 24, each having a large capacitance, in order to gain a sufficiently large pulse width for each of the trigger pulses in the conventional circuit of FIG. 1.

It should be noted that in the trigger pulse generator of FIG. 3 the transistors 26 and 28 are depletion-type FET's. The reason why depletion-type FET's are used is because if enhancement-type transistors are used as the transistors 26 and 28, the transistor 26 or 28 is cut off when the gate potential is higher than the source or drain potential and the output signals A' and $\overline{A}'$ are not transferred to the inverters 12 and 14.

Figure 5:
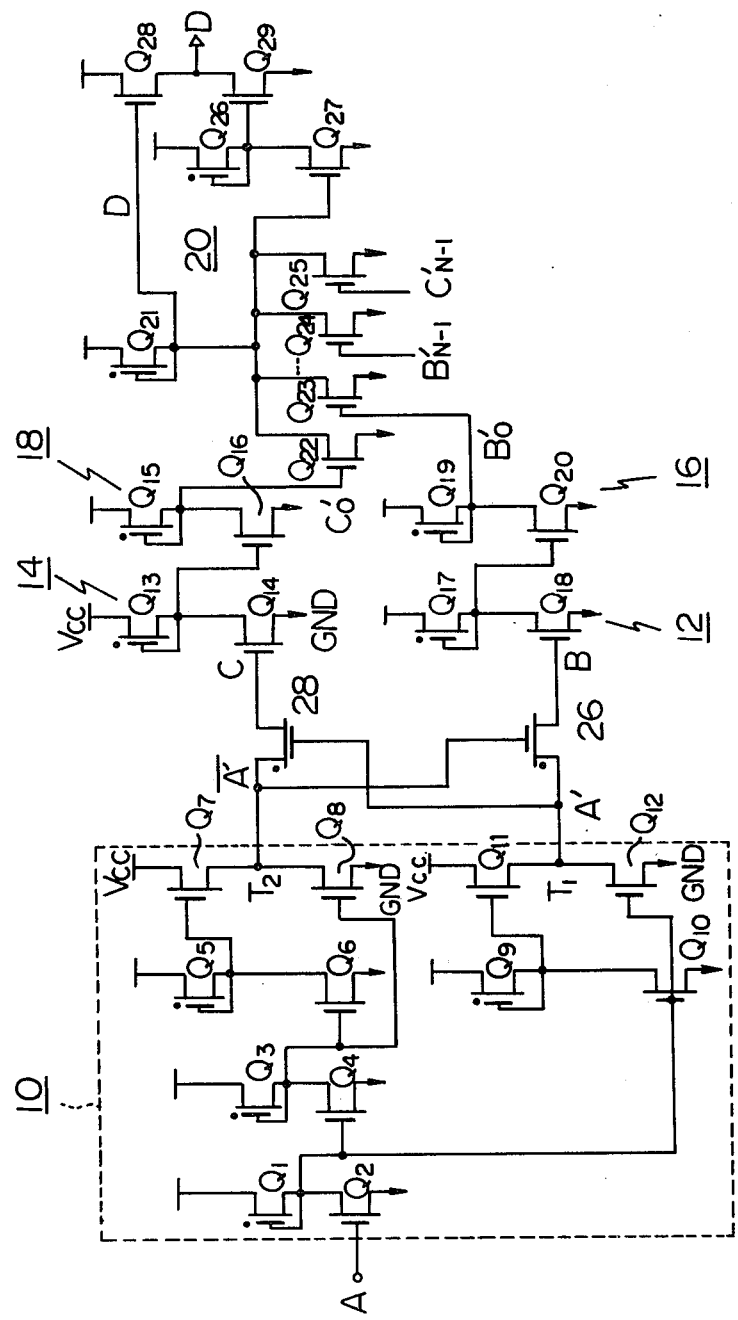
FIG. 5 is a circuit diagram of the detailed circuit of the trigger pulse generator of FIG. 3.

FIG. 5 is a detailed circuit structure of the trigger pulse generator of FIG. 3. In FIG. 5, the same parts as those appearing in FIG. 3 are designated by the same reference numbers and symbols. The amplifier 10 comprises transistors Q1 through Q12. The transistors Q1 and Q2; Q3 and Q4; Q5 and Q6; and Q9 and Q10 constitute inverters, respectively. Push-pull-type output stages connected to the output terminals $T_1$ and $T_2$ comprise the transistors Q7 and Q8 and Q11 and Q12, respectively. Transistors Q17 and Q18, Q13 and Q14, Q19 and Q20, and Q15 and Q16 constitute the inverters 12, 14, 16, and 18, respectively. A depletion-type transistor Q21 and enhancement-type transistors Q22 through Q25 constitute the NOR gate 20, and the output signal D from the NOR gate 20 is supplied to an output buffer comprising transistors Q26 through Q29. The drains of transistors $Q_1$, $Q_3$, $Q_5$, $Q_7$, $Q_9$ and $Q_{11}$ are connected to the voltage source $V_{cc}$, respectively, and the sources of transistors $Q_2$, $Q_4$, $Q_6$, $Q_8$, $Q_{10}$ and $Q_{12}$ are connected to ground, respectively.

Operation of the circuit of FIG. 5 is the same as described above with reference to FIG. 3. When the input signal A falls from high to low, the signal $\overline{A}'$ at the output terminal $T_2$ rises to a high level which is nearly equal to the power supply voltage $V_{cc}$ and the signal A' at the output terminal $T_1$ falls to a low level which is nearly equal to ground level. Therefore, the gm of the depletion transistor 28 becomes small and the signal C applied to the inverter 14 rises slowly. In this case, the gate of the transistor 28 is at ground level and the signal C rises only to a potential level which is higher than the gate potential, i.e., ground level, by the threshold potential $|Vth(28)|$ of the transistor 28. Therefore, the potential of the high level of the signal C is not influenced by the change in the power supply voltage $V_{cc}$. In FIG. 5, signals $B_{N-1}'$ and $C_{N-1}'$ applied to the gates of the transistors Q24 and Q25 are supplied from other amplifiers, for example, address buffers.

As mentioned above, according to the present invention, there is provided a trigger pulse generator in which the width of each of the output trigger pulses is not affected by the change in the power supply voltage. It is also possible to obtain output trigger pulses which synchronize with the rising and falling edges of an input signal and have a large pulse width without using capacitors having a large capacitance. Therefore, it is easy and advantageous to use the trigger pulse generator according to the present invention in an integrated circuit. The trigger pulse generator according to the present invention is suitable for use in a semiconductor memory device in order to shorten the access time. However, it is also possible to use the trigger pulse generator according to the present invention in other circuits or devices.

I claim:

1. A trigger pulse generator for generating trigger pulses synchronized with the rising edges and falling edges of an input signal, comprising:
   an amplifier, operatively connected to receive the input signal, having a non-inverting output terminal and an inverting output terminal;
   a first depletion-type MIS transistor having a threshold voltage, a drain or source electrode operatively connected to said non-inverting output terminal of said amplifier for outputting a signal and a gate electrode operatively connected to said inverting output terminal of said amplifier;
   a second depletion-type MIS transistor having a threshold voltage, a drain or source electrode operatively connected to said non-inverting output terminal of said amplifier for outputting a signal and a gate electrode operatively connected to said non-inverting output terminal of said amplifier; and
   a gate circuit operatively connected to said first and second depletion-type MIS transistors, which generates the trigger pulses synchronized with the rising edges and the falling edges of the input signal upon receipt of said signals from said source or drain electrodes of said first depletion-type MIS transistor and said second depletion-type MIS transistor.

2. A trigger pulse generator according to claim 1, further comprising two-stage inverters, operatively connected between said first and second depletion-type MIS transistors and said gate circuit, having an input circuit with a threshold voltage, wherein each of said signals from said source or drain electrodes of said first depletion-type MIS transistor and said second-depletion type MIS transistor is wave-shaped by said two-stage inverters before each of said signals is applied to said gate circuit.

3. A trigger generator according to claim 2, wherein the threshold voltage of said first depletion-type MIS transistor and said second-depletion type MIS transistor is less than or equal to said threshold voltage of said input circuit of said two-stage inverters.

4. A trigger pulse generator according to claim 1, 2 or 3, wherein said gate circuit is a NOR gate having an output terminal.

5. A trigger pulse generator according to claim 4, wherein said NOR gate comprises a depletion-type MIS load transistor and a plurality of enhancement-type MIS driver transistors.

6. A trigger pulse generator according to claim 4, wherein said amplifier comprises a plurality of push-pull type output circuits operatively connected to said first and second depletion-type MIS transistors, wherein each of said plurality of push-pull type output circuits comprises two enhancement-type MIS transistors.

7. A trigger pulse generator according to claim 6, wherein said amplifier is an address buffer of a semiconductor memory device.

8. A trigger pulse generator according to claim 4, further comprising an output buffer operatively connected to said output terminal of said NOR gate circuit.

* * * * *

UNITED STATES PATENT AND TRADEMARK OFFICE
CERTIFICATE OF CORRECTION

PATENT NO. : 4,464,581
DATED : AUGUST 7, 1984
INVENTOR(S) : ATSUSHI ORITANI

It is certified that error appears in the above-identified patent and that said Letters Patent is hereby corrected as shown below:

Col. 2, line 56, "pulses" should be --pulses synchronized--.

Col. 4, line 3, "cronizes" should be --chronizes--;
line 21, "as" should be --is--.

Col. 5, line 56, "$B_{N-1}$," should be --$B'_{N-1}$--; and

"$C_{N-1}$," should be --$C'_{N-1}$--.

Signed and Sealed this

Fifth Day of March 1985

[SEAL]

Attest:

DONALD J. QUIGG

Attesting Officer   Acting Commissioner of Patents and Trademarks